(12) United States Patent
Huang et al.

(10) Patent No.: US 10,692,928 B1
(45) Date of Patent: Jun. 23, 2020

(54) SEMICONDUCTOR DEVICE AND METHOD FOR FABRICATING THE SAME

(71) Applicant: UNITED MICROELECTRONICS CORP., Hsin-Chu (TW)

(72) Inventors: Ting-Hsiang Huang, Tainan (TW); Yi-Chung Sheng, Tainan (TW); Sheng-Yuan Hsueh, Tainan (TW); Kuo-Hsing Lee, Hsinchu County (TW); Chih-Kai Kang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/260,129

(22) Filed: Jan. 29, 2019

(30) Foreign Application Priority Data

Dec. 24, 2018 (CN) .......................... 2018 1 1582285

(51) Int. Cl.
| | |
|---|---|
| *H01L 27/22* | (2006.01) |
| *H01L 29/66* | (2006.01) |
| *H01L 43/12* | (2006.01) |
| *H01L 43/08* | (2006.01) |
| *H01L 29/08* | (2006.01) |
| *H01L 29/49* | (2006.01) |
| *H01L 43/02* | (2006.01) |

(52) U.S. Cl.
CPC ........ *H01L 27/228* (2013.01); *H01L 29/0847* (2013.01); *H01L 29/4966* (2013.01); *H01L 29/66492* (2013.01); *H01L 29/66545* (2013.01); *H01L 43/02* (2013.01); *H01L 43/08* (2013.01); *H01L 43/12* (2013.01)

(58) Field of Classification Search
CPC ............... H01L 27/228; H01L 29/0847; H01L 29/4966; H01L 29/66492; H01L 29/66545
USPC .......................................................... 257/421
See application file for complete search history.

(56) References Cited

U.S. PATENT DOCUMENTS

| | | | |
|---|---|---|---|
| 8,848,423 B2* | 9/2014 | Chung ................... | G11C 17/18 365/148 |
| 2017/0323886 A1* | 11/2017 | Chuang ................. | H01L 27/088 |

FOREIGN PATENT DOCUMENTS

WO    WO 2015/147882      10/2015

* cited by examiner

*Primary Examiner* — Tu-Tu V Ho
(74) *Attorney, Agent, or Firm* — Winston Hsu

(57) ABSTRACT

A semiconductor device includes: a dummy gate on a substrate; a first control gate on one side of the dummy gate and a second control gate on another side of the dummy gate; a well in the substrate, wherein the well comprises a first conductive type; a first source/drain region between the dummy gate and the first control gate, wherein the first source/drain region comprises a second conductive type; a second source/drain region between the dummy gate and the second control gate, wherein the second source/drain region comprises the second conductive type; and a doped region directly under the dummy gate, wherein the doped region comprises the first conductive type.

16 Claims, 4 Drawing Sheets

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of: forming a dummy gate on a substrate; forming a first control gate on one side of the dummy gate and a second control gate on another side of the dummy gate; and performing a treatment process so that a threshold voltage of the dummy gate is greater than a threshold voltage of the first control gate.

According to another aspect of the present invention, a semiconductor device includes: a dummy gate on a substrate; a first control gate on one side of the dummy gate and a second control gate on another side of the dummy gate; a well in the substrate, wherein the well comprises a first conductive type; a first source/drain region between the dummy gate and the first control gate, wherein the first source/drain region comprises a second conductive type; a second source/drain region between the dummy gate and the second control gate, wherein the second source/drain region comprises the second conductive type; and a doped region directly under the dummy gate, wherein the doped region comprises the first conductive type.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
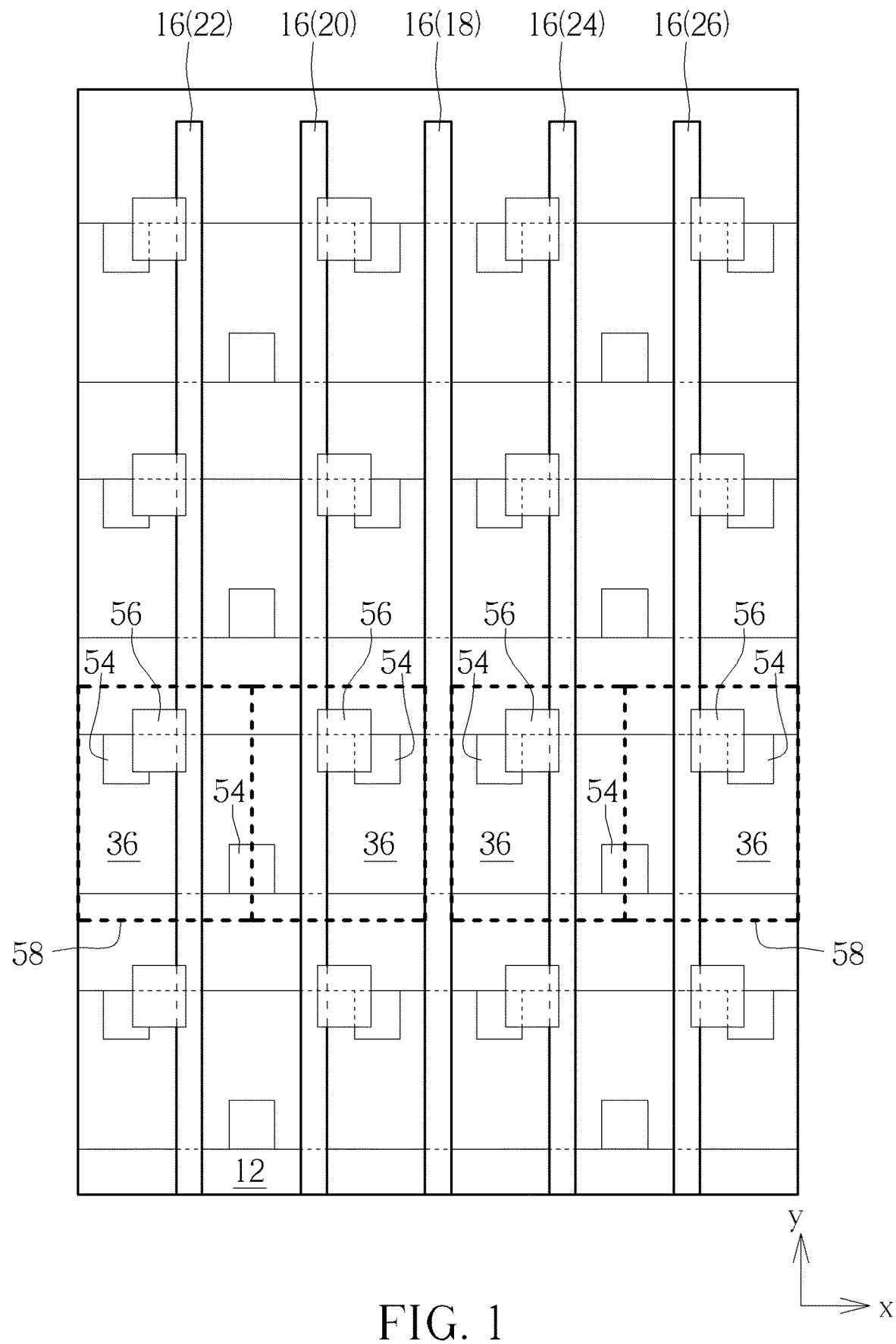
FIG. 1 illustrates a top view of a MRAM according to an embodiment of the present invention.
Figure 2:
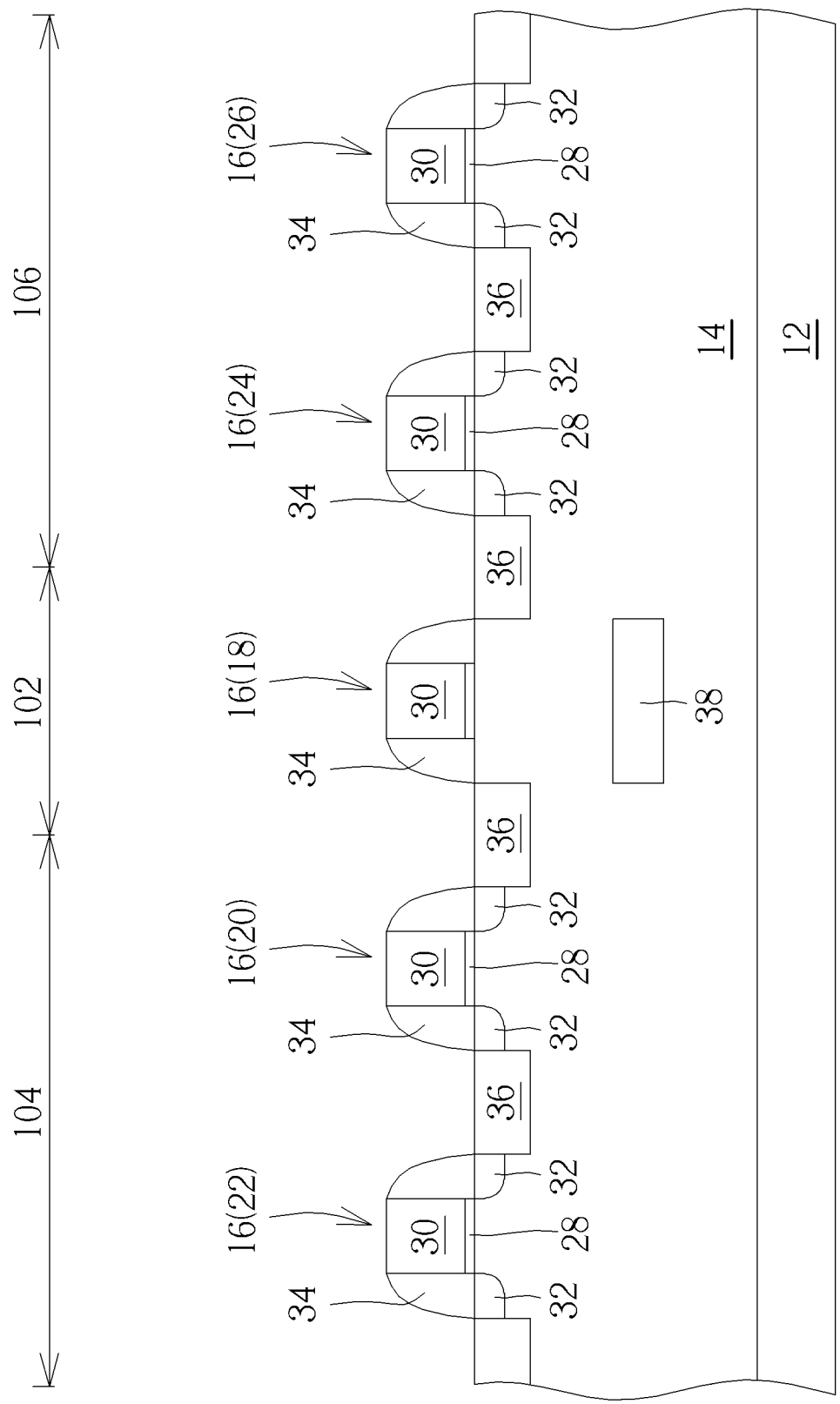
FIG. 2 illustrates a cross-section view of a MRAM according to an embodiment of the present invention.

Referring to FIGS. 1-2, FIGS. 1-2 illustrate a method for fabricating semiconductor device, or more specifically a MRAM according to an embodiment of the present invention, in which FIG. 1 illustrates a top view of a MRAM according to an embodiment of the present invention and FIG. 2 illustrates a cross-section view of a MRAM according to an embodiment of the present invention. As shown in FIGS. 1-2, a substrate 12 such as a silicon substrate or silicon-on-insulator (SOI) substrate is provided and a first region 102, a second region 104, and a third region 106 are defined on the substrate 12, in which the first region 102 preferably being a high voltage (HV) region Next, a well or well region 14 is formed in the substrate 12 and at least gate structures 16 are formed on the substrate 12, in which the gate structures 16 include a dummy gate 18, control gates 20, 22 disposed on one side of the dummy gate 18, and control gates 24, 26 disposed on another side of the dummy gate 18. In this embodiment, the formation of the gate structures 16 could be accomplished by a gate first process, a high-k first approach from gate last process, or a high-k last approach from gate last process. Since this embodiment pertains to a high-k last approach, a gate dielectric layer 28 or interfacial layer, a gate material layer 30 made of polysilicon, and a selective hard mask (not shown) could be formed sequentially on the substrate 12, and a pattern transfer process is then conducted by using a patterned resist (not shown) as mask to remove part of the gate material layer 30 and part of the gate dielectric layer 28 through single or multiple etching processes. After stripping the patterned resist, gate structures 16 each composed of a patterned gate dielectric layer 28 and patterned material layer 30 are formed on the substrate 12.

Next, a patterned mask (not shown) could be formed to cover the dummy gate 18, and an ion implantation process is conducted to form lightly doped drains (LDDs) in the substrate 12 adjacent to two sides of the control gates 20, 22, 24, 26. Next, at least a spacer 34 is formed on the sidewalls of each of the gate structures 16, a source/drain region 36 and/or epitaxial layer (not shown) is formed in the substrate 12 adjacent to two sides of the spacers 34, and a selective silicide layer (not shown) could be formed on the surface of the source/drain region 36. In this embodiment, each of the spacers 34 could be a single spacer or a composite spacer, such as a spacer including but not limited to for example an offset spacer (not shown) and a main spacer (not shown). Preferably, the offset spacer and the main spacer could include same material or different material while both the offset spacer and the main spacer could be made of material including but not limited to for example SiO$_2$, SiN, SiON, SiCN, or combination thereof. The source/drain regions 36 could include n-type dopants or p-type dopants depending on the type of device being fabricated.

It should be noted the control gates 20, 22, 24, 26 adjacent to two sides of the dummy gate 18 in a MRAM device are typically operated under same threshold voltage and in such instance leakages would easily occur on the dummy gate 18. To resolve this issue, the present invention preferably conducts a treatment process so that a threshold voltage of the dummy gate 18 would become greater than the threshold voltage of the control gates 20, 22, 24, 26. In this embodiment, the treatment process could be accomplished by conducting an extra ion implantation to form a doped region 38 directly under the dummy gate 18 and spacer 34 either before or after the gate structures 16 are formed. Preferably, the doped region 38 and the well region 14 in the substrate 12 share same conductive type such as a first conductive type while the lightly doped drains 32 and the source/drain regions include a second conductive type different from the first conductive type. Moreover, the concentration of the well region 14 is also less than the concentration of the doped region 38 while the concentration of the doped region 38 is further less than the concentration of the lightly doped drains 32 and source/drain regions 36.

Figure 3:
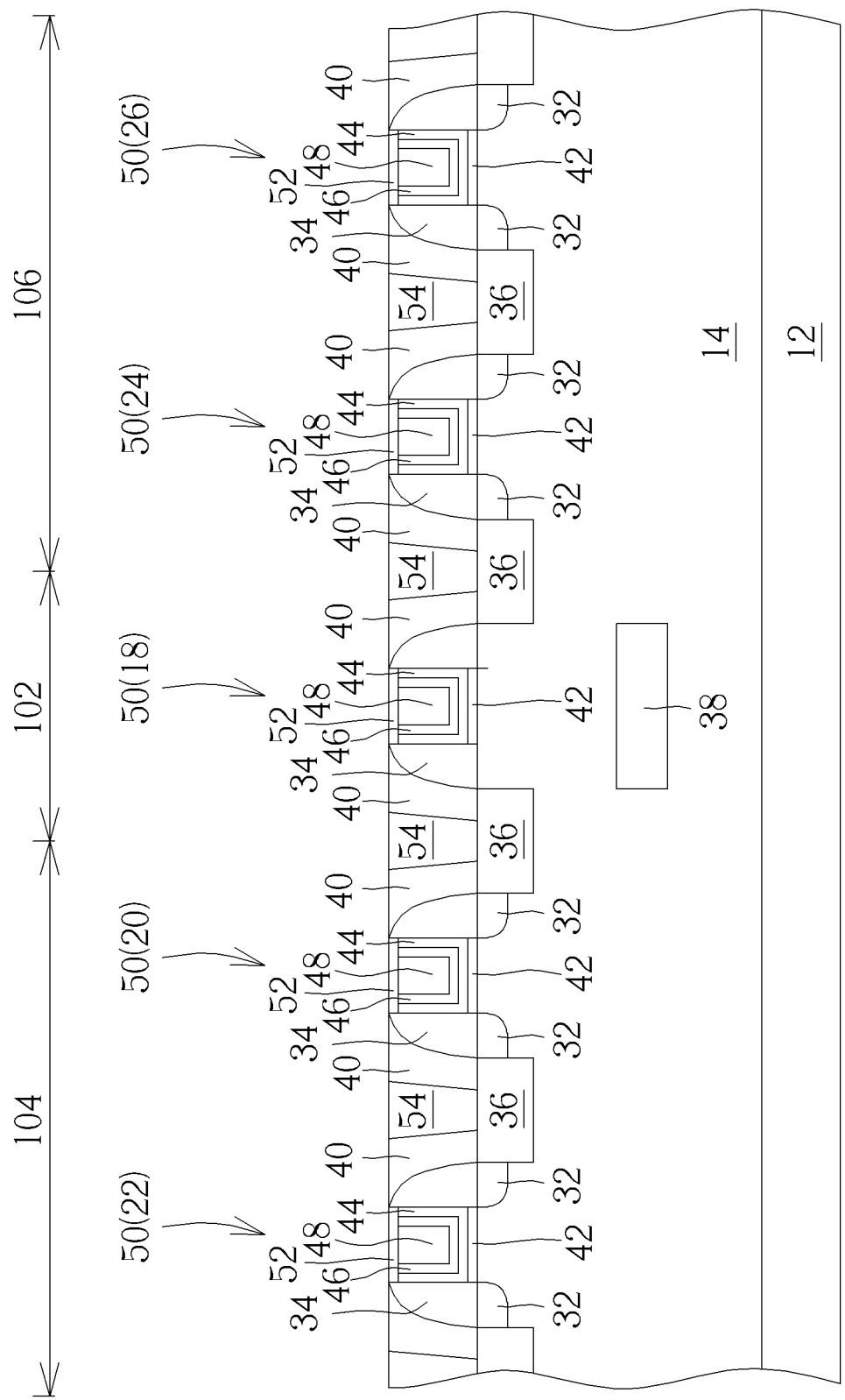
FIG. 3 illustrates a cross-section view of a MRAM according to an embodiment of the present invention.

Next, as shown in FIG. 3, a selective contact etch stop layer (CESL) (not shown) could be formed on the surface of the substrate 12 to cover the dummy gate 18 and control gates 20, 22, 24, 26, and an interlayer dielectric (ILD) layer 40 is formed on the CESL. Next, a planarizing process such as chemical mechanical polishing (CMP) process is conducted to remove part of the ILD layer 40 and part of the CESL for exposing the gate material layer 30 made of polysilicon so that the top surface of the gate material layer 30 is even with the top surface of the ILD layer 40.

Next, a replacement metal gate (RMG) process is conducted to transform the each of the gate structures including the dummy gate 18 and control gates 20, 22, 24, 26 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 30 and even the gate dielectric layer 28 for forming a recess (not shown) in the ILD layer 40. Next, a selective interfacial layer 42 or another gate dielectric layer, a high-k dielectric layer 44, a work function metal layer 46, and a low resistance metal layer 48 are formed in the recess, and a planarizing process such as CMP is conducted to remove part of low resistance metal layer 48, part of work function metal layer 46, and part of high-k dielectric layer 44 to form metal gates 50.

Next, part of the low resistance metal layer 48, part of the work function metal layer 46, and part of the high-k dielectric layer 44 are removed to form another recess (not shown), and a hard mask 52 made of dielectric material including but not limited to for example silicon nitride is deposited into the recess so that the top surfaces of the hard mask 52 and ILD layer 40 are coplanar. In this embodiment, the gate structure or metal gate 50 fabricated through high-k last process of a gate last process preferably includes an interfacial layer or gate dielectric layer 42, a U-shaped high-k dielectric layer 44, a U-shaped work function metal layer 46, and a low resistance metal layer 48.

In this embodiment, the high-k dielectric layer 44 is preferably selected from dielectric materials having dielectric constant (k value) larger than 4. For instance, the high-k dielectric layer 44 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 46 is formed for tuning the work function of the metal gate in accordance with the conductivity of the device. For an NMOS transistor, the work function metal layer 46 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 46 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 46 and the low resistance metal layer 48, in which the material of the barrier layer may include titanium (Ti), titanium nitride (TiN), tantalum (Ta) or tantalum nitride (TaN). Furthermore, the material of the low-resistance metal layer 48 may include copper (Cu), aluminum (Al), titanium aluminum (TiAl), cobalt tungsten phosphide (CoWP) or any combination thereof.

It should be noted that in addition to forming a doped layer 38 directly under the dummy gate 18 so that the threshold voltage of the dummy gate 18 would be greater than the threshold voltage of the adjacent control gates 20, 22, 24, 26, according to another embodiment of the present invention, it would also be desirable to adjust the work function of the dummy gate 18 and control gates 20, 22, 24, 26 to achieve the same effect by tuning the work function of the dummy gate 18 toward the direction of higher work function value (such as the direction of p-type work function).

Specifically, it would be desirable to form only n-type work function metal layer in the control gates 20, 22, 24, 26 without any p-type work function metal layer while p-type work function metal layer (s) are formed in the dummy gate 18 so that the threshold voltage of the dummy gate 18 would be greater than the threshold voltage of the adjacent control gates 20, 22, 24, 26. Moreover, according to yet another embodiment of the present invention, it would also be desirable to form p-type work function metal layers in both control gates 20, 22, 24, 26 and the dummy gate 18 while the thickness of the p-type work function metal layer in the dummy gate 18 is greater than the thickness of p-type work function metal layer in each of the control gates 20, 22, 24, 26, which are all within the scope of the present invention.

Next, a photo-etching process is conducted by using a patterned mask (not shown) as mask to remove part of the ILD layer 40 adjacent to the metal gate 50 for forming contact holes (not shown) exposing the source/drain regions 36 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 54 electrically connecting the source/drain regions 36. This completes the fabrication of a semiconductor device according to a preferred embodiment of the present invention.

Next, metal interconnective process could be conducted to form at least an inter-metal dielectric (IMD) layer on the ILD layer 40, and at least a magnetic tunneling junction (MTJ) 56 is formed in the IMD layer to electrically connect the source/drain regions 36 adjacent to two sides of the dummy gate 18, as shown in FIG. 1.

Preferably, the MTJ 56 could include a bottom electrode, a pinned layer, a barrier layer, a free layer, a capping layer, and a top electrode. In this embodiment, the bottom electrode and the top electrode are preferably made of conductive material including but not limited to for example Ta, Pt, Cu, Au, Al, or combination thereof. The pinned layer could be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field. The capping layer could be made of insulating material including but not limited to for example oxides such as aluminum oxide (AlO$_x$) or magnesium oxide (MgO).

Referring again to FIG. 1 and FIG. 3, in which FIGS. 1 and 3 are structural views illustrating a MRAM device according to an embodiment of the present invention. As shown in FIGS. 1 and 3, the MRAM. preferably includes a dummy gate 18 disposed on a substrate 12, control gates 20, 22 disposed on one side of the dummy gate 18, control gates, 24, 26 disposed on another side of the dummy gate 18, a well region 14 disposed in the substrate 12, lightly doped drains 32 disposed adjacent to two sides of the control gates 20, 22, 24, 26, spacers 34 surrounding each of the gate structures of metal gates 50, source/drain regions 36 disposed adjacent to two sides of the dummy gate 18 and control gates 20, 22, 24, 26, and a doped region 38 disposed directly under the dummy gate 18.

As shown in FIG. 1, the dummy gate is extended along a first direction such as Y-direction on the substrate 12, the control gates 20, 22, 24, 26 are also extended along the first direction adjacent to two sides of the dummy gate 18, the source/drain regions 36 are extended along a second direction different from the first direction adjacent to two sides of the dummy gate 18, and contact plugs 54 and MTJs 56 are disposed adjacent to two sides of the control gates 20, 22, 24, 26 to electrically connect the source/drain regions 36. In this embodiment, the control gate such as the control gate 20 on one side of the dummy gate 18, the contact plug 54 and MTJ 56 disposed on the right of the control gate 20, and part of the contact plug 54 on the left of the control gate 20 together constitute a single MRAM unit 58 marked by the dotted lines. In other words, two MRAM units 58 constituted by control gates 20, 22 on the left side of the dummy gate 18 and two MRAM units 58 constituted by control gates 24, 26 on the right side of the dummy gate 18 are preferably disposed adjacent to two sides of the dummy gate 18 respectively.

In this embodiment, the top surface of the doped region 38 is preferably lower than the bottom or bottommost surface of the source/drain regions 36 and the area or edges of the doped region 38 preferably do not extend to surpass the outermost sidewalls of the spacers 34 around the dummy gate 18 while no lightly doped drain 32 is disposed directly under the dummy gate 18 and the spacer 34 surrounding the dummy gate 18. In other word, the doped region 38 is only disposed directly under the dummy gate 18 and spacer 34 adjacent tot eh dummy gate 18 while not surpassing the edges of the adjacent source/drain regions 36. Moreover, the doped region 38 and the well region 14 preferably share same conductive type such as a first conductive type while the lightly doped drains 32 and source/drain regions 36 preferably include a second conductive type different from the first conductive type. Preferably, the concentration of the well region 14 is less than the concentration of the doped region 38 while the concentration of the doped region 38 is also less than the concentration of each of the lightly doped drains 32 and source/drain regions 36.

As stated previously, in addition to forming the doped region 38 directly under the dummy gate 18 so that the threshold voltage of the dummy gate 18 would be greater than the threshold voltage of the adjacent control gates 20, 22, 24, 26, according to another embodiment of the present invention, it would also be desirable to adjust the work function of the dummy gate 18 and control gates 20, 22, 24, 26 to achieve the same effect by tuning the work function of the dummy gate 18 toward the direction of higher work function value (such as the direction of p-type work function).

As shown in FIG. 3, each of the dummy gate 18 and control gates 20, 22, 24, 26 includes a metal gate 50 and each of the metal gates 50 preferably includes an interfacial layer 42 or gate dielectric layer, a U-shaped high-k dielectric layer 44, a U-shaped work function metal layer 46, and a low resistance metal layer 48. According to an embodiment of the present invention, it would be desirable to form only n-type work function metal layer in the control gates 20, 22, 24, 26 without any p-type work function metal layer while p-type work function metal layer (s) are formed in the dummy gate 18 so that the threshold voltage of the dummy gate 18 could be greater than the threshold voltage of the adjacent control gates 20, 22, 24, 26. Moreover, according to yet another embodiment of the present invention, it would also be desirable to form p-type work function metal layers in both control gates 20, 22, 24, 26 and the dummy gate 18 while the thickness of the p-type work function metal layer in the dummy gate 18 is greater than the thickness of p-type work function metal layer in each of the control gates 20, 22, 24, 26, which are all within the scope of the present invention.

Figure 4:
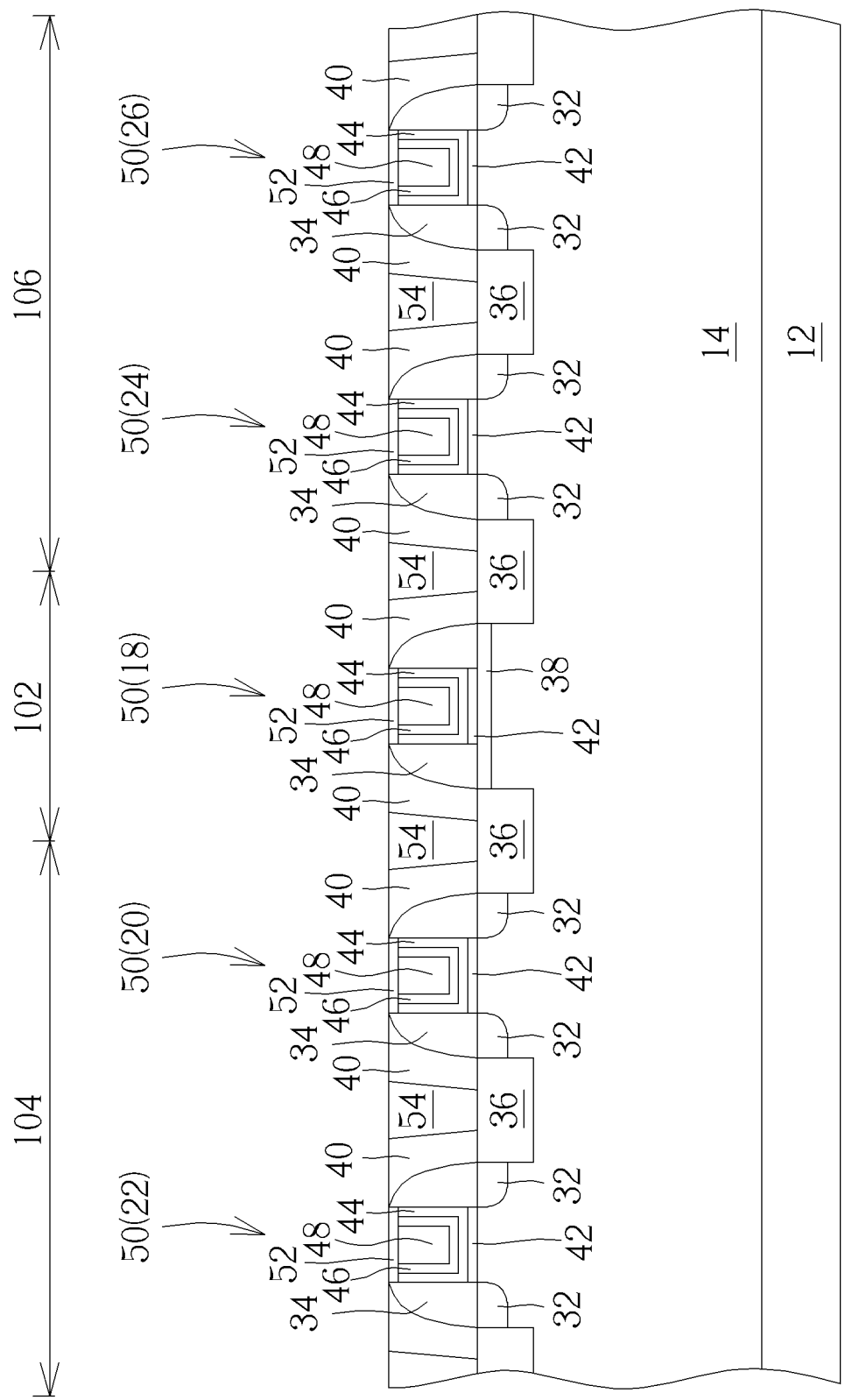
FIG. 4 illustrates s structural view of a MRAM according to an embodiment of the present invention.

Referring to FIG. 4, FIG. 4 illustrates a structural view of a MRAM device according to an embodiment of the present invention. As shown in FIG. 4, in contrast to the top surface of the doped region 38 being lower than the bottom surface of the adjacent source/drain regions 36 as disclosed in the embodiment in FIG. 3, according to an embodiment of the present invention, it would also be desirable to adjust the energy of the ion implantation process during formation of the doped region 38 so that the doped region 38 could be formed close to the surface of the substrate 12 instead of in the inner region of the substrate 12. For instance, as shown in FIG. 4, it would be desirable to adjust the depth of the doped region 38 so that the top surface of the doped region 38 is even with the surface of the substrate 12 while the bottom surface of the doped region 38 is lower than the bottom surface of the lightly doped drains 32 and source/drain regions 36, and the doped region 38 directly contacts the bottom surface of the interfacial layer 42 of the dummy gate 18, the bottom surface of the spacer 34, and the source/drain regions 36 on the adjacent two sides, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a dummy gate on a substrate;
    forming a first control gate on one side of the dummy gate and a second control gate on another side of the dummy gate;
    forming a first source/drain region between the dummy gate and the first control gate; and
    performing a treatment process so that a threshold voltage of the dummy gate is greater than a threshold voltage of the first control gate, wherein the treatment process comprises:
        forming a doped region directly under the dummy gate, wherein a top surface of the doped region is lower than a bottom surface of the first source/drain region.

2. The method of claim 1, further comprising:
    forming a well in the substrate, wherein the well comprises a first conductive type;
    forming a first spacer around the first control gate, a second spacer around the second control gate, and a third spacer around the dummy gate;
    forming the first source/drain region between the dummy gate and the first control gate, wherein the first source/drain region comprises a second conductive type; and
    forming a second source/drain region between the dummy gate and the second control gate, wherein the second source/drain region comprises the second conductive type.

3. The method of claim 2, further comprising:
    forming a first magnetic tunneling junction (MTJ) electrically connected to the first source/drain region; and
    forming a second MTJ electrically connected to the second source/drain region.

4. The method of claim 2, further comprising:
    forming a first lightly doped drain (LDD) adjacent to two sides of the first control gate; and
    forming a second LDD adjacent to two sides of the second control gate.

5. The method of claim 4, wherein the treatment process comprises:
    forming the doped region directly under the dummy gate and the third spacer, wherein the doped region comprises the first conductive type.

6. The method of claim 1, wherein each of the dummy gate, the first control gate, and the second control gate comprises a metal gate.

7. The method of claim 6, wherein the first control gate and the second control gate comprise a n-type work function metal layer and the dummy gate comprises a p-type work function metal layer.

8. The method of claim 6, wherein each of the dummy gate, the first control gate, and the second control gate comprises a p-type work function metal layer and a thickness of the p-type work function metal layer in the dummy gate is greater than a thickness of the p-type work function metal layer in the first control gate or the second control gate.

9. A semiconductor device, comprising:
    a dummy gate on a substrate;
    a first control gate on one side of the dummy gate and a second control gate on another side of the dummy gate;
    a well in the substrate, wherein the well comprises a first conductive type;
    a first source/drain region between the dummy gate and the first control gate, wherein the first source/drain region comprises a second conductive type;
    a second source/drain region between the dummy gate and the second control gate, wherein the second source/drain region comprises the second conductive type; and
    a doped region directly under the dummy gate, wherein the doped region comprises the first conductive type and a top surface of the doped region is lower than a bottom surface of the first source/drain region.

10. The semiconductor device of claim 9, further comprising:
    a first spacer around the first control gate, a second spacer around the second control gate, and a third spacer around the dummy gate, wherein the doped region is directly under the dummy gate and the third spacer.

11. The semiconductor device of claim 10, further comprising:
    a first lightly doped drain (LDD) adjacent to two sides of the first control gate; and
    a second LDD adjacent to two sides of the second control gate.

12. The semiconductor device of claim 9, wherein each of the dummy gate, the first control gate, and the second control gate comprises a metal gate.

13. The semiconductor device of claim 12, wherein the first control gate and the second control gate comprise a n-type work function metal layer and the dummy gate comprises a p-type work function metal layer.

14. The semiconductor device of claim 12, wherein each of the dummy gate, the first control gate, and the second control gate comprises a p-type work function metal layer and a thickness of the p-type work function metal layer in the dummy gate is greater than a thickness of the p-type work function metal layer in the first control gate or the second control gate.

15. The semiconductor device of claim 9, further comprising:
    a first magnetic tunneling junction (MTJ) electrically connected to the first source/drain region; and
    a second MTJ electrically connected to the second source/drain region.

16. A method for fabricating semiconductor device, comprising:
    forming a dummy gate on a substrate;
    forming a first control gate on one side of the dummy gate and a second control gate on another side of the dummy gate; and
    performing a treatment process by adjusting work function values of the dummy gate and the first control gate so that a threshold voltage of the dummy gate is greater than a threshold voltage of the first control gate.

* * * * *